United States Patent
Nelson et al.

(10) Patent No.: US 10,316,245 B2
(45) Date of Patent: Jun. 11, 2019

(54) QUANTUM DOT FILM

(71) Applicants: 3M INNOVATIVE PROPERTIES COMPANY, Saint Paul, MN (US); NANOSYS INC., Milpitas, CA (US)

(72) Inventors: Eric W. Nelson, Stillwater, MN (US); Karissa L. Eckert, Blaine, MN (US); William Blake Kolb, West Lakeland, MN (US); Tyler D. Nesvik, St. Paul, MN (US); Minghu Tu, Milpitas, CA (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 249 days.

(21) Appl. No.: 14/762,173

(22) PCT Filed: Jan. 16, 2014

(86) PCT No.: PCT/US2014/011837
§ 371 (c)(1),
(2) Date: Jul. 20, 2015

(87) PCT Pub. No.: WO2014/113562
PCT Pub. Date: Jul. 24, 2014

(65) Prior Publication Data
US 2015/0368553 A1    Dec. 24, 2015

Related U.S. Application Data

(60) Provisional application No. 61/754,786, filed on Jan. 21, 2013.

(51) Int. Cl.
| | |
|---|---|
| *C09K 11/02* | (2006.01) |
| *B32B 7/12* | (2006.01) |
| *B32B 27/08* | (2006.01) |
| *B32B 27/36* | (2006.01) |
| *B82Y 20/00* | (2011.01) |
| *B82Y 40/00* | (2011.01) |
| *C09K 11/56* | (2006.01) |
| *C09K 11/88* | (2006.01) |
| *H01L 33/50* | (2010.01) |

(52) U.S. Cl.
CPC .............. *C09K 11/025* (2013.01); *B32B 7/12* (2013.01); *B32B 27/08* (2013.01); *B32B 27/36* (2013.01); *C09K 11/02* (2013.01); *C09K 11/565* (2013.01); *C09K 11/883* (2013.01); *H01L 33/501* (2013.01); *H01L 33/505* (2013.01); *B32B 2250/02* (2013.01); *B32B 2250/24* (2013.01); *B32B 2250/40* (2013.01); *B32B 2255/10* (2013.01); *B32B 2255/26* (2013.01); *B32B 2264/10* (2013.01); *B32B 2264/102* (2013.01); *B32B 2264/12* (2013.01); *B32B 2307/712* (2013.01); *B32B 2307/7244* (2013.01); *B32B 2307/7246* (2013.01); *B32B 2307/7265* (2013.01); *B32B 2457/20* (2013.01); *B32B 2551/00* (2013.01); *B82Y 20/00* (2013.01); *B82Y 40/00* (2013.01); *H01L 33/502* (2013.01); *Y10S 977/774* (2013.01); *Y10S 977/783* (2013.01); *Y10S 977/892* (2013.01); *Y10S 977/932* (2013.01); *Y10T 428/25* (2015.01); *Y10T 428/31515* (2015.04)

(58) Field of Classification Search
None
See application file for complete search history.

(56) References Cited

U.S. PATENT DOCUMENTS

| | | | |
|---|---|---|---|
| 6,517,744 B1 | 2/2003 | Hara | |
| 7,737,046 B2 | 6/2010 | Takeda | |
| 7,982,812 B2 | 7/2011 | Rho | |
| 2005/0135079 A1* | 6/2005 | Yin Chua | B82Y 10/00 362/12 |
| 2005/0230693 A1 | 10/2005 | Chen | |
| 2010/0167011 A1 | 7/2010 | Dubrow | |
| 2011/0284824 A1 | 11/2011 | Liu | |
| 2012/0113671 A1 | 5/2012 | Sadasivan | |
| 2012/0113672 A1 | 5/2012 | Dubrow | |
| 2012/0156436 A1 | 6/2012 | Kim | |
| 2013/0334557 A1 | 12/2013 | Uchida | |

FOREIGN PATENT DOCUMENTS

| | | |
|---|---|---|
| CN | 102270749 | 12/2011 |
| CN | 102280595 | 12/2011 |
| CN | 102504822 | 6/2012 |
| JP | 55-41488 | 3/1980 |
| JP | 63-193980 | 8/1988 |
| JP | 2008-179820 | 8/2008 |

(Continued)

OTHER PUBLICATIONS

Simic, "Gas barrier and adhesion of interpenetrating polymer networks based on poly(diurethane bismethacrylate) and different epoxy amine networks", European Polymer Journal, 2002, vol. 38, pp. 2449-2458.

(Continued)

*Primary Examiner* — Sheeba Ahmed
(74) *Attorney, Agent, or Firm* — Lisa P. Fulton

(57) ABSTRACT

A quantum dot film article includes a first barrier film, a second barrier film, and a quantum dot layer separating the first barrier from the second barrier film. The quantum dot layer includes quantum dots dispersed in a polymer material. The polymer material includes a methacrylate polymer, an epoxy polymer and a photoinitiator.

22 Claims, 1 Drawing Sheet

(56) References Cited

FOREIGN PATENT DOCUMENTS

| | | |
|---|---|---|
| WO | 2009/151515 | 12/2009 |
| WO | WO 2010-120422 | 10/2010 |
| WO | WO 2011-008295 | 1/2011 |
| WO | WO 2011-036446 | 3/2011 |
| WO | 2012/064562 | 5/2012 |
| WO | WO 2012/088404 | 6/2012 |

OTHER PUBLICATIONS

International Search report for PCT International Application No. PCT/US2014/011837 dated May 7, 2014, 4 pages.

\* cited by examiner

QUANTUM DOT FILM

FIELD

The disclosure relates to quantum dot films and methods of forming quantum dot films having reduced defects.

BACKGROUND

Quantum dot films and elements are utilized in display and other optical constructions. The quantum dots need to be sealed from oxygen and water. Thus these quantum dots have been dispersed in a polymer such as an epoxy and sandwiched between two barrier films.

During the formation of the quantum dot films the epoxy polymer is formed from a 2-part epoxy amine resin. Increasing the cure temperature is utilized to shorten the cure time of these epoxy polymers. However, increased cure temperatures have been found to cause defects in the quantum dot films. As the cure temperature increases, the polymer precursor viscosity decreases prior to the onset of cure. This low viscosity allows the polymer precursor to move within the laminate construction. In addition, this polymer precursor can move in response to stresses caused by barrier film shrinkage, line tension mismatch and non-uniform heating, for example.

BRIEF SUMMARY

The disclosure relates to quantum dot films and method of forming quantum dot films having reduced defects. An interpenetrating polymer network is formed by the addition of a radiation curable methacrylate to an epoxy amine laminating adhesive forming a matrix for quantum dots. The radiation curable methacrylate increases viscosity of the epoxy amine laminating adhesive to a point that defect generation is eliminated or greatly reduced during high temperature cure of the epoxy amine.

In a first aspect of the disclosure, a quantum dot film article includes a first barrier film, a second barrier film, and a quantum dot layer separating the first barrier from the second barrier film. The quantum dot layer includes quantum dots dispersed in a polymer material. The polymer material includes a methacrylate polymer, an epoxy polymer and a photoinitiator.

In one or more embodiments, the methacrylate polymer comprises 5 to 25 wt % or 10 to 20 wt % of the quantum dot layer. In one or more embodiments, the epoxy polymer comprises 70 to 90 wt % of the quantum dot layer.

In one or more embodiments, the epoxy polymer comprises an epoxy amine polymer. In one or more embodiments, the methacrylate polymer is formed by radiation polymerization of di- or tri-functional methacrylate polymer precursors. In one or more embodiments, the epoxy polymer is formed by thermal polymerization of difunctional amine and diepoxide.

In a second aspect of the disclosure, a method of forming a quantum dot film article includes coating a quantum dot material on a first barrier layer and disposing a second barrier layer on the quantum dot material. The quantum dot material includes quantum dots, photoinitiator, 5 to 25% wt methacrylate polymer precursors and 70 to 90 wt % epoxy polymer precursors. The quantum dot material having a first viscosity at a first temperature.

In one or more embodiments the method of forming a quantum dot film article includes polymerizing the methacrylate polymer precursors to form a partially cured quantum dot material. In one or more embodiments the method of forming a quantum dot film article includes polymerizing the epoxy polymer precursors of the partially cured quantum dot material to form a cured quantum dot material.

In one or more embodiments the method of forming a quantum dot film article includes radiation polymerizing the methacrylate polymer precursors. In one or more embodiments the method of forming a quantum dot film article includes thermal polymerizing the epoxy polymer precursors.

In one or more embodiments the method of forming a quantum dot film article includes forming a partially cured quantum dot material having a second viscosity at the first temperature being at least 10 times greater than the first viscosity. In one or more embodiments the method of forming a quantum dot film article includes forming a partially cured quantum dot material having a second viscosity at the first temperature being at least 20 times greater than the first viscosity. In one or more embodiments the method of forming a quantum dot film article includes the first viscosity being less than 10000 centipoise. In one or more embodiments the method of forming a quantum dot film article includes the second viscosity being greater than 100000 centipoise.

In one or more embodiments the method of forming a quantum dot film article includes epoxy polymer precursors being a difunctional amine and diepoxide. In one or more embodiments the method of forming a quantum dot film article includes methacrylate polymer precursors being di- or tri-functional methacrylate polymer precursors.

In a third aspect of the disclosure, a quantum dot material includes quantum dots, photoinitiator, 5 to 25% wt methacrylate polymer precursors, and 70 to 90 wt % epoxy polymer precursors.

In one or more embodiments the quantum dot material includes UV curable methacrylate polymer precursors and thermally curable epoxy polymer precursors.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

The disclosure may be more completely understood in consideration of the following detailed description of various embodiments of the disclosure in connection with the accompanying drawings, in which.

DETAILED DESCRIPTION

Figure 1:
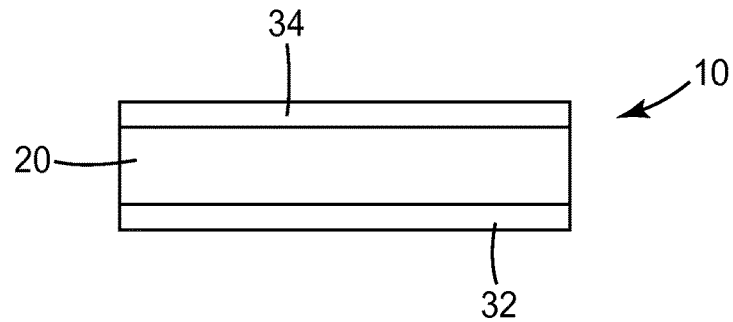
FIG. 1 is a schematic side elevation view of an illustrative quantum dot film.

In the following detailed description, reference is made to the accompanying drawings that form a part hereof, and in which are shown by way of illustration several specific embodiments. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as being "directly on," "directly connected to," "directly coupled with," or "directly in contact with" another element, there are no intervening elements, components or layers for example.

As used herein, "have", "having", "include", "including", "comprise", "comprising" or the like are used in their open ended sense, and generally mean "including, but not limited to." It will be understood that the terms "consisting of" and "consisting essentially of" are subsumed in the term "comprising," and the like.

The disclosure relates to quantum dot films and methods of forming quantum dot films having reduced defects, among other aspects. An interpenetrating polymer network is formed by the addition of a radiation curable methacrylate to an epoxy amine laminating adhesive forming a matrix for quantum dots. The radiation curable methacrylate increases a viscosity of the epoxy amine laminating adhesive and reduces defects that would otherwise be created during the thermal acceleration of the epoxy amine. The radiation curable methacrylate is provided in a relatively low level (e.g., 5-25% wt) without reducing the functional properties of the epoxy amine polymer. Following radiation cure, the viscosity of the system is increased greatly allowing for easier handling of the product on the coating and processing line. The radiation cure can occur right after lamination of the two barrier films. Thus, the increase in viscosity locks in the coating quality right after lamination. The radiation cure of the methacrylate portion of the laminating adhesive provides greater control over coating, curing and web handling as compared to traditional thermal curing of an epoxy only laminating adhesive. While the present disclosure is not so limited, an appreciation of various aspects of the disclosure will be gained through a discussion of the examples provided below.

Figure 2:
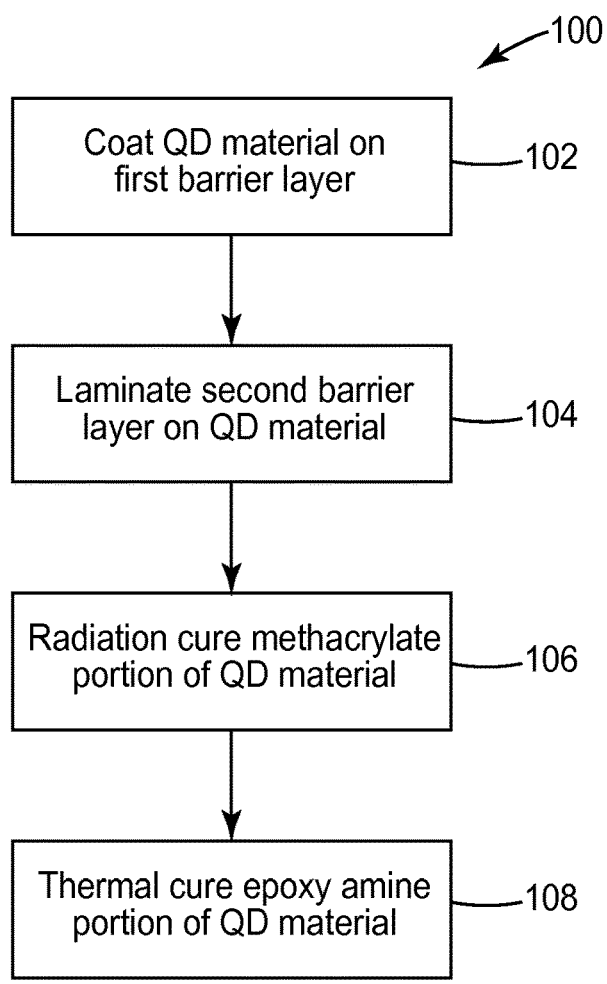
FIG. 2 is a flow diagram of an illustrative method of forming a quantum dot film.

FIG. 1 is a schematic side elevation view of an illustrative quantum dot film 10. FIG. 2 is a flow diagram of an illustrative method 100 of forming a quantum dot film.

In one or more embodiments, a quantum dot (QD) film article 10 includes a first barrier film 32, a second barrier film 34, and a quantum dot layer 20 separating the first barrier 32 from the second barrier film 34. The quantum dot layer 20 includes quantum dots dispersed in a polymer material. The polymer material includes a methacrylate polymer, an epoxy polymer and a photoinitiator.

In one or more embodiments, a method of forming a quantum dot film article 100 includes coating a quantum dot material on a first barrier layer 102 and disposing a second barrier layer on the quantum dot material 104. The quantum dot material includes quantum dots, photoinitiator, 5 to 25% wt methacrylate polymer precursors and 70 to 90 wt % epoxy polymer precursors. The quantum dot material has a first viscosity at a first temperature.

In many embodiments the method of forming a quantum dot film article 100 includes polymerizing (e.g., radiation curing) the methacrylate polymer precursors to form a partially cured quantum dot material 106 and polymerizing (e.g., thermal curing) the epoxy polymer precursors of the partially cured quantum dot material to form a cured quantum dot material 108.

In many embodiments, the method of forming a quantum dot film article includes forming a partially cured quantum dot material having a second viscosity at the first temperature being at least 10 times greater or at least 20 times greater than the first viscosity. In one or more embodiments the first viscosity is less than 10000 centipoise and the second viscosity is greater than 100000 centipoise.

Barrier films 32, 34 can be formed of any useful film material that can protect the quantum dots from environmental conditions such as oxygen and moisture. Suitable barrier films include polymers, glass or dielectric materials, for example. Suitable barrier layer materials include, but are not limited to, polymers such as polyethylene terephthalate (PET); oxides such as silicon oxide, titanium oxide, or aluminum oxide (e.g., $SiO_2$, $Si_2O_3$, $TiO_2$, or $Al_2O_3$); and suitable combinations thereof. In many embodiments each barrier layer of the QD film includes at least two layers of different materials or compositions, such that the multi-layered barrier eliminates or reduces pinhole defect alignment in the barrier layer, providing an effective barrier to oxygen and moisture penetration into the QD phosphor material. The QD film can include any suitable material or combination of materials and any suitable number of barrier layers on either or both sides of the QD phosphor material. The materials, thickness, and number of barrier layers will depend on the particular application, and will suitably be chosen to maximize barrier protection and brightness of the QD phosphor while minimizing thickness of the QD film. In many embodiments each barrier layer is a laminate film, such as a dual laminate film, where the thickness of each barrier layer is sufficiently thick to eliminate wrinkling in roll-to-roll or laminate manufacturing processes. In one illustrative embodiment the barrier films are polyester films (e.g., PET) having an oxide layer.

The quantum dot material 20 can include one or more populations of quantum dot material. Exemplary quantum dots or quantum dot material emit green light and red light upon down-conversion of blue primary light from the blue LED to secondary light emitted by the quantum dots. The respective portions of red, green, and blue light can be controlled to achieve a desired white point for the white light emitted by a display device incorporating the quantum dot film article. Exemplary quantum dots for use in quantum dot film articles described herein include CdSe with ZnS shells. Suitable quantum dots for use in quantum dot film articles described herein include core/shell luminescent nanocrystals including CdSe/ZnS, InP/ZnS, PbSe/PbS, CdSe/CdS, CdTe/CdS or CdTe/ZnS. In exemplary embodiments, the luminescent nanocrystals include an outer ligand coating and are dispersed in a polymeric matrix. Quantum dot and quantum dot material are commercially available from Nanosys Inc., Palo Alto, Calif. The quantum dot layer can have any useful amount of quantum dots. In many embodiments the quantum dot layer can have from 0.1 to 1% wt quantum dots.

In one or more embodiments the quantum dot material 20 can include scattering beads or particles. These scattering beads or particles have a different refractive index than the refractive index of the epoxy polymer such as, by at least 0.05 or by at least 0.1. These scattering beads or particles can include polymers such as silicone, acrylic, nylon, etc. These scattering beads or particles can include inorganics such as $TiO_2$, $SiO_x$, $AlO_x$, etc. The inclusion of scattering particles results in a longer optical path length and improved quantum dot absorption and efficiency. In many embodiments, the particle size is in a range from 1 to 10 micrometers, or from 2 to 6 micrometers. In many embodiments, the quantum dot material 20 can include fillers such fumed silica.

Due to the fast Michael addition of acrylates, methacrylates are used to preserve the working time of the epoxy amine polymer system. An interpenetrating polymer network is formed by the addition of a radiation curable methacrylate to the epoxy amine laminating adhesive forming a matrix for quantum dots. The radiation curable methacrylate increases a viscosity of the epoxy amine laminating adhesive and reduces defects that would otherwise be created during the thermal acceleration of the epoxy amine. The radiation curable methacrylate is provided in a relatively low level without reducing the functional properties of the epoxy amine polymer. The methacrylate polymer forms 5 to 25 wt % or 10 to 20 wt % of the quantum dot layer. If the methacrylate polymer forms more than 25 wt % of the quantum dot layer, it has been found that the methacrylate polymer fails to adhere to the barrier film and fails to provide adequate barrier properties. If the methacrylate polymer forms less than 5 wt % of the quantum dot layer, it has been found that the methacrylate polymer fails to adequately increase viscosity of the quantum dot layer. The methacrylate polymer is formed by radiation polymerization of di- or tri-functional methacrylate polymer precursors. Useful methacrylates are those with acceptable barrier properties, for example those with a bisphenol-A, bisphenol-F and resorcinol backbones. Methacrylates with high Tg and high crosslink densities will provide improved gas and water vapor barrier properties.

Following radiation cure, the viscosity of the system is increased greatly, thereby allowing for easier handling of the product on the coating and processing lines. The radiation cure can occur right after lamination of the two barrier films. Thus, the increase in viscosity locks in the coating quality right after lamination. By curing right after coating or laminating, the UV cured methacrylate increases the viscosity to a point that the resin acts like a pressure sensitive adhesive (PSA) and holds the laminate together during the thermal cure of the epoxy amine and greatly reduces defects during a high temperature cure (70 to 120 degrees centigrade) of the epoxy amine. The radiation cure of the methacrylate portion of the laminating adhesive provides greater control over coating, curing and web handling as compared to traditional thermal curing of an epoxy only laminating adhesive.

The epoxy polymer includes an epoxy amine polymer. The epoxy polymer is formed by thermal polymerization of difunctional amine and diepoxide. The epoxy polymer forms 70 to 90 wt % of the quantum dot layer. In many embodiments, the refractive index of the epoxy amine polymer material is in a range from 1.48 to 1.60 or from 1.50 to 1.57. The higher refractive index improves scattering when low refractive index particles or emulsions are used. This results in a longer optical path length and improved quantum dot efficiency. Conjugation in high refractive index materials also decreases the water vapor and oxygen transport rates.

Some of the advantages of the disclosed quantum dot films are further illustrated by the following examples. The particular materials, amounts and dimensions recited in this example, as well as other conditions and details, should not be construed to unduly limit the present disclosure.

EXAMPLES

Example 1

Two types of solutions were prepared, one according to the current invention and one a control.

The components and amounts of the control solution, Solution A, are shown in Table 1. The control solution was thus an epoxy-only formulation. Epon 828 was a general purpose epoxy resin available from Momentive Specialty Chemicals (Columbus, Ohio). Part B was Epic RMX91B, a difunitional amine curative, (available from Epic Resins, Palmyra, Wis.) with a 15% white quantum dot concentrate (available from Nanosys Corp., Palo Alto, Calif.) which results in a final quantum dot concentration of 0.1 to 1 wt % in the cured epoxy quantum dot layer.

The components of Solution B, a hybrid epoxy/methacrylate formulation, are shown in Table 2. Three different versions of Solution B were prepared, each with a different methacrylate. The chosen methacrylates were SR348, SR540, and SR239, all from Sartomer USA, LLC (Exton, Pa.). Epon 824 was an epoxy resin available from Momentive Specialty Chemicals (Columbus, Ohio). Each of the three variations of Solution B used the amount of methacrylate shown in Table 2. Darocur 4265, a photoinitiator, was available from BASF Resins (Wyandotte, Mich.). All components except for curing agent Part B (Epic RMX91B with 15% quantum dots) were added and mixed together. The Part B was mixed with the rest of the solution immediately before coating.

TABLE 1

| Solution A | | |
|---|---|---|
| | Wt % | Amt (g) |
| Epon 828 | 65.0% | 325.0 |
| Part B | 35.0% | 1625.0 |
| Total | 100.0% | 500.0 |

TABLE 2

| Solution B | | |
|---|---|---|
| | Wt % | Amt (g) |
| Epon 824 | 55.6% | 278.0 |
| Methacrylate | 13.9% | 69.7 |
| Darocur 4265 | 0.50% | 2.6 |
| Part B | 29.9% | 149.7 |
| Total | 100.0% | 500.00 |

Each of the solutions were mixed and coated between two 2 mil silicon release liners at a thickness of 50 micrometers with a knife coater. The coatings were first cured with ultraviolet (UV) radiation using a Fusion F600 VPS system (from Fusion US Systems Inc, Gaithersburg Md.) at a line speed of 30 feet per minute and with an output in the UVA band of 1.88 Joules/cm$^2$, and then thermally cured in an oven at 220° F. for 5 minutes. Water vapor transmission rates were then measured (WVTR) using a Mocon Permatran-W Model 1/50 G (available from Mocon Corporation, Minneapolis, Minn.). Table 3 shows the results of the test for Solution A and the three variations of Solution B. Addition of the methacrylate did not adversely affect the water vapor barrier properties of the film compared to Solution A-coated film with no methacrylate.

The above solutions were also coated between two 5 mil barrier films (available as FTB3-M-125 from 3M Company, St. Paul Minn.) at a thickness of 100 micrometers using a knife coater. The coatings were UV and thermally cured as described above. Adhesion testing was performed with a T-peel test (ASTM D1876-08) on samples from these coated films. Results are also shown in Table 3.

TABLE 3

| Methacrylate Used | None | SR348 | SR540 | SR239 |
|---|---|---|---|---|
| WVTR (20 g/m2-mil-day) | 25 | 25 | 29 | 51 |
| Peel Test (g/in) | 24 | 22 | 21 | 81 |

A solution similar to Solution B was prepared, except that 14% of the SR348 bisphenol A based di-methacrylate was used as the methacrylate. Viscosity of the solution was measured before and after curing using a Discovery Hybrid Rheometer HR-2 from TA Instruments (New Castle, Del.). The initial viscosity was measured at a shear rate of 40 sec$^{-1}$. The viscosity after UV-curing was measured using an oscillation technique. Results are shown in Table 4. A dramatic increase in viscosity was observed. Such viscosity increases are advantageous in dramatically reducing defects seen during thermal curing.

TABLE 4

| Sample ID | Initial Viscosity (cps) | Viscosity after UV Cure (cps) |
|---|---|---|
| 14% SR348 in Epon 824 | 3200 | >1,000,000 (gelled) |

Example 2

Control Solution A was prepared as in Example 1. Solutions B through G were prepared as with the methacrylate solutions of Example 1 except that the methacrylate used was SR348 at six different levels ranging from 5% to 30% by weight. Components of all solutions are shown in Table 5.

TABLE 5

| | Solution A | Solution B | Solution C | Solution D | Solution E | Solution F | Solution G |
|---|---|---|---|---|---|---|---|
| % Methacrylate | 0% | 14% | 30% | 25% | 20% | 10% | 5% |
| | SR348 | SR348 | SR348 | SR348 | SR348 | SR348 | SR348 |
| Epon 824 | 65.0% | 55.6% | 45.2% | 48.4% | 51.7% | 58.2% | 61.4% |
| SR348 | | 14.0% | 30.0% | 25.0% | 20.0% | 10.0% | 5.00% |
| Darocur 4265 | | 0.50% | 0.50% | 0.50% | 0.50% | 0.50% | 0.50% |
| Part B | 35.0% | 29.9% | 24.3% | 26.1% | 27.8% | 31.3% | 33.1% |
| Total | 100.0% | 100.0% | 100.0% | 100.0% | 100.0% | 100.0% | 100.0% |

The above solutions were mixed and coated between two 2 mil silicon release liners at a thickness of 50 micrometers with a knife coater as before, then UV and thermally cured as in Example 1. Water vapor transmission rates were measured as in Example 1. Results are shown in Table 6. Water vapor transmission properties were relatively insensitive to the amount of methacrylate.

TABLE 6

| | Solution A | Solution B | Solution C | Solution D | Solution E | Solution F | Solution G |
|---|---|---|---|---|---|---|---|
| % Methacrylate | 0% | 14% | 30% | 25% | 20% | 10% | 5% |
| | SR348 | SR348 | SR348 | SR348 | SR348 | SR348 | SR348 |
| WVRT (20 g/m2-mil-day) | 25 | 25 | 53 | 37 | 33 | 22 | 27 |
| T-peel (g/in) | 24 | 22 | 22 | 22 | 21 | 24 | 31 |

Example 3

Two solutions were prepared to compare the peel strength performance of films with and without quantum dots.

Solution J was prepared with the proportions described in Table 7 below and was similar to previous formulations. Solution B was similar except that the Part B component was Epic RMX91B without the quantum dot concentrate The components of each solution are shown in Table 7. The two solutions were coated at 20 feet per minute on a pilot coater using a slot fed die with ¼ inch face and rear feed. Part A consisted of DER362 (diepoxy from Dow Chemical, Midland, Mich.), SR348 and Darocur 4265 and was fed via one pressure pot under nitrogen and Part B (the Epic RMX91B with or without quantum dots) was fed by another pressure pot, also under nitrogen. The two parts were fed into a static mixer before feeding into the die. The ratio of Part A to Part B was 2.3 to 1. Each solution was coated onto a 2 mil barrier film (previously described) and then immediately laminated to another 2 mil barrier film. For Solution J a nitrogen purge box was place around the coating head to insure that the oxygen concentration at the coating head stayed below 50 parts per million. The coatings were UV-cured as in Example 2, and left to cure at room temperature for 2 days. Then they were cured in an oven at 90° C. for 2 hours. Peel testing was done as described in Example 3. The results are shown in Table 8.

TABLE 7

|  | Solution B | Solution J |
|---|---|---|
| DER362 | 55.6% | 55.6% |
| SR348 | 14.0% | 14.0% |
| Darocur 4265 | 0.50% | 0.50% |
| Epic RMX91B | 29.9% | 0.00% |
| Epic RMX91B w 15% white dot concentrate | 0.00% | 29.9% |
| Total | 100.0% | 100.0% |

TABLE 8

|  | Solution B | Solution J |
|---|---|---|
| Quantum Dots | No | Yes |
| Peel Strength (g/in) | 95 | 155 |

Embodiments of the present disclosure are disclosed. The disclosed embodiments are presented for purposes of illustration and not limitation. The implementations described above and other implementations are within the scope of the following claims. One skilled in the art will appreciate that the present disclosure can be practiced with embodiments other than those disclosed. Those having skill in the art will appreciate that many changes may be made to the details of the above-described embodiments and implementations without departing from the underlying principles thereof. Further, various modifications and alterations of the present invention will become apparent to those skilled in the art without departing from the spirit and scope of the present disclosure. The scope of the present application should, therefore, be determined only by the following claims.

What is claimed is:

1. A quantum dot film article comprising:
   a first barrier film;
   a second barrier film; and
   a quantum dot layer separating the first barrier film from the second barrier film, the quantum dot layer comprising quantum dots dispersed in a polymer material, the polymer material comprising a methacrylate polymer with a bisphenol-A, bisphenol-F or resorcinol backbone, an epoxy polymer and a photoinitiator.

2. A quantum dot film article according to claim 1, wherein the methacrylate polymer comprises 5 to 25 wt % of the quantum dot layer.

3. A quantum dot film article according to claim 1, wherein the methacrylate polymer comprises 10 to 20 wt % of the quantum dot layer.

4. A quantum dot film article according to claim 1, wherein the epoxy polymer comprises 70 to 90 wt % of the quantum dot layer.

5. A quantum dot film article according to claim 1, wherein the epoxy polymer comprises an epoxy amine polymer.

6. A quantum dot film article according to claim 1, wherein the epoxy polymer has a refractive index of 1.48 to 1.60.

7. A quantum dot film article according to claim 1, wherein the epoxy polymer contains scattering particles having an average size in a range from 1 to 10 micrometers.

8. A quantum dot film article according to claim 1, wherein the methacrylate polymer is formed by radiation polymerization of di- or tri-functional methacrylate polymer precursors.

9. A quantum dot film article according to claim 1, wherein the epoxy polymer is formed by thermal polymerization of difunctional amine and diepoxide.

10. A method of forming a quantum dot film article comprising:
    coating a quantum dot material on a first barrier layer, the quantum dot material comprising:
    quantum dots;
    photoinitiator;
    5 to 25% wt methacrylate polymer precursors with a bisphenol-A, bisphenol-F or resorcinol backbone; and
    70 to 90 wt % epoxy polymer precursors;
    the quantum dot material having a first viscosity at a first temperature; and
    disposing a second barrier layer on the quantum dot material.

11. A method according to claim 10, further comprising polymerizing the methacrylate polymer precursors to form a partially cured quantum dot material.

12. A method according to claim 11, further comprising polymerizing the epoxy polymer precursors of the partially cured quantum dot material to form a cured quantum dot material.

13. A method according to claim 11, wherein polymerizing the methacrylate polymer precursors comprises radiation polymerizing the methacrylate polymer precursors.

14. A method according to claim 12, wherein polymerizing the epoxy polymer precursors comprises thermal polymerizing the epoxy polymer precursors.

15. A method according to claim 11, wherein polymerizing the methacrylate polymer precursors forms a partially cured quantum dot material having a second viscosity at the first temperature being at least 10 times greater than the first viscosity.

16. A method according to claim 11, wherein polymerizing the methacrylate polymer precursors forms a partially cured quantum dot material having a second viscosity at the first temperature being at least 20 times greater than the first viscosity.

17. A method according to claim 10, wherein the first viscosity is less than 10000 centipoise.

18. A method according to claim 15, wherein the second viscosity is greater than 100000 centipoise.

19. A method according to claim 10, wherein the epoxy polymer precursors comprise difunctional amine and diepoxide.

20. A method according to claim 10, wherein the methacrylate polymer precursors comprise di- or tri-functional methacrylate polymer precursors.

21. A quantum dot material comprising:
   quantum dots;
   photoinitiator;
   5 to 25% wt methacrylate polymer precursors with a bisphenol-A, bisphenol-F or resorcinol backbone; and
   70 to 90 wt % epoxy polymer precursors.

22. A quantum dot material according to claim 21, wherein the methacrylate polymer precursors are UV curable methacrylate polymer precursors and the epoxy polymer precursors are thermally curable epoxy polymer precursors.

* * * * *